(12) United States Patent
Zamir et al.

(10) Patent No.: US 11,456,754 B2
(45) Date of Patent: Sep. 27, 2022

(54) FIXED SIZE SOFT BIT LOSSY COMPRESSION IN FLASH MEMORY

(71) Applicant: Western Digital Technologies, Inc., San Jose, CA (US)

(72) Inventors: Ran Zamir, Ramat Gan (IL); Eran Sharon, Rishon Lezion (IL); Idan Alrod, Herzeliya (IL); Alexander Bazarsky, Holon (IL); Yan Li, Milpitas, CA (US); A Harihara Sravan, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 110 days.

(21) Appl. No.: 17/177,940

(22) Filed: Feb. 17, 2021

(65) Prior Publication Data

US 2022/0116053 A1    Apr. 14, 2022

Related U.S. Application Data

(60) Provisional application No. 63/090,936, filed on Oct. 13, 2020.

(51) Int. Cl.
| | |
|---|---|
| *H03M 7/00* | (2006.01) |
| *H03M 7/30* | (2006.01) |
| *G06F 12/08* | (2016.01) |
| *G06F 11/00* | (2006.01) |
| *G11C 16/26* | (2006.01) |
| *G11C 11/56* | (2006.01) |

(52) U.S. Cl.
CPC ......... *H03M 7/3062* (2013.01); *G06F 11/008* (2013.01); *G06F 12/08* (2013.01); *H03M 7/3064* (2013.01); *G06F 2212/401* (2013.01); *G11C 11/5671* (2013.01); *G11C 16/26* (2013.01)

(58) Field of Classification Search
CPC ... H03M 7/3062; H03M 7/3064; G06F 12/08; G06F 11/008; G06F 2212/401; G11C 16/26; G11C 11/5671
See application file for complete search history.

(56) References Cited

U.S. PATENT DOCUMENTS

| | | | |
|---|---|---|---|
| 8,099,652 | B1 | 1/2012 | Alrod et al. |
| 8,464,131 | B2 | 6/2013 | Sharon et al. |
| 8,509,000 | B2 | 8/2013 | Sharon et al. |
| 8,873,285 | B2 | 10/2014 | Sharon et al. |

(Continued)

*Primary Examiner* — Joseph J Lauture
(74) *Attorney, Agent, or Firm* — Michael Best & Friedrich LLP

(57) ABSTRACT

A memory includes, in one embodiment, one or more storage elements; read/write circuitry; and compressed bit circuitry. The read/write circuitry is configured to read a set of hard bits from the one or more storage elements, and sense a set of soft bits while reading the set of hard bits from the one or more storage elements, the set of soft bits having a first fixed size, and the set of soft bits indicating a reliability of the set of hard bits. The compressed soft bit circuitry is configured to generate, with a fixed size soft bit lossy compression algorithm, a fixed size compressed soft bits by compressing the set of soft bits, the fixed size compressed soft bits having a second fixed size that is smaller than the first fixed size, and output the fixed size compressed soft bits to a memory-to-controller bus.

20 Claims, 6 Drawing Sheets

(56) References Cited

U.S. PATENT DOCUMENTS

| | | |
|---|---|---|
| 9,032,269 B2 | 5/2015 | Sharon et al. |
| 9,329,928 B2 | 5/2016 | Fitzpatrick et al. |
| 9,406,377 B2 | 8/2016 | Conley et al. |
| 9,491,023 B2 | 11/2016 | Butussi et al. |
| 9,641,378 B1 | 5/2017 | Steffen |
| 9,882,678 B2 | 1/2018 | Nekuii |
| 9,946,468 B2 | 4/2018 | Conley et al. |
| 10,275,186 B2 | 4/2019 | Sharon et al. |
| 10,474,525 B2 | 11/2019 | Sharon et al. |
| 10,715,177 B2 | 7/2020 | Ki et al. |
| 2006/0193470 A1 | 8/2006 | Williams |
| 2014/0237315 A1* | 8/2014 | Fitzpatrick .......... G06F 11/1012 714/755 |
| 2017/0046220 A1 | 2/2017 | Sharon et al. |
| 2017/0153844 A1 | 6/2017 | Kwon et al. |
| 2018/0017889 A1 | 1/2018 | Seki |
| 2018/0159559 A1 | 6/2018 | Bazarsky et al. |
| 2018/0159560 A1 | 6/2018 | Sharon et al. |
| 2020/0042378 A1 | 2/2020 | Pele et al. |

\* cited by examiner

FIXED SIZE SOFT BIT LOSSY COMPRESSION IN FLASH MEMORY

CROSS-REFERENCE TO RELATED APPLICATION

This application claims priority to and the benefit of U.S. Provisional Patent Application No. 63/090,936, filed on Oct. 13, 2020, the entire contents of which is incorporated herein by reference.

BACKGROUND

This application relates generally to memory devices and, more particularly, to soft bit lossy compression in memory devices.

Non-volatile storage devices include flash memory devices and other storage devices. In a flash memory device, a storage element may be programmed to store a particular threshold voltage that indicates one or more bit values. For example, a particular range of threshold voltages may correspond to a logic "1" bit value, and another range of threshold voltages may correspond to a logic "0" bit value.

Non-volatile storage devices may use error correction techniques to improve reliability of data storage and retrieval. For example, data may be encoded prior to being stored at a storage device, and the data may be decoded after being read from the storage device to correct one or more errors in the data (up to an error correction capability, such as a probabilistic error correction capability).

Certain error correction techniques use soft bits to improve the error correction capability. These soft bits may be generated by reading higher/lower than the transition and marking the bits near the transition threshold. A soft bit may indicate a reliability of a hard bit read from a storage element. As an example, a hard bit may indicate a logic "0" bit value, and a soft bit corresponding to the hard bit may indicate that the logic "0" bit value is relatively reliable (e.g., if a read voltage that reflects a state of a storage element is relatively far from the read threshold) or that the logic "0" bit value is relatively unreliable (e.g., if the read voltage indicating the state of the storage element is adjacent to a boundary of the target range of threshold voltages). Soft bits may improve a decoding process by indicating which bits of data are likely to be "incorrect" (e.g., due to being near a boundary of a threshold voltage range). Generating and using soft bits consumes resources at a storage device. For example, additional sensing operations may be performed to generate soft bits (as compared to generating only hard bits during a read process). As another example, transferring soft bits from a memory to a controller may use system bandwidth and may reduce resources available for other operations, which may slow performance of the memory in some cases.

SUMMARY

The present disclosure includes devices, methods, and apparatuses that have fixed size input and output soft bit lossy compression (referred to hereinafter as "fixed size soft bit lossy compression"). Conventionally, lossless compression algorithms such as Huffman coding or Run-Length coding (RLC) are complicated to implement, mainly due to the "variable length" of either input, output, or both. Further, lossy compression algorithms (such as bitwise operations) may also be implemented. The present disclosure provides a fixed size soft bit lossy compression that is more efficient and works on a fixed size, that is, works on a small fixed vector size and compresses to a smaller fixed size. Additionally, the fixed size soft bit lossy compression of the present disclosure significantly reduces the complexity of the conventional soft bit lossy compression algorithm, while still achieving good compression ratio and with minimal data loss. The present disclosure allows defined memory spaces, such as pages, to be split into smaller fixed size segments. The present disclosure also allows for lossy compression to be performed in a distributed manner.

The disclosure provides a memory including, in one embodiment, one or more storage elements, read/write circuitry, and compressed soft bit circuitry. The read/write circuitry is configured to read a set of hard bits from the one or more storage elements, and sense a set of soft bits while reading the set of hard bits from the one or more storage elements, the set of soft bits having a first fixed size, and each soft bit of the set of soft bits indicating a reliability of a corresponding hard bit of the set of hard bits. The compressed soft bit circuitry is configured to receive the set of soft bits, generate, with a fixed size soft bit lossy compression algorithm, a fixed size compressed soft bits by compressing the set of soft bits, the fixed size compressed soft bits having a second fixed size that is smaller than the first fixed size, and output the fixed size compressed soft bits to a memory-to-controller bus.

The disclosure also provides a method. In one embodiment, the method includes reading, with read/write circuitry, a set of hard bits from one or more storage elements. The method includes sensing, with the read/write circuitry, a set of soft bits while reading the set of hard bits from the one or more storage elements, the set of soft bits having a first fixed size, and each soft bit of the set of soft bits indicating a reliability of a corresponding hard bit of the set of hard bits. The method includes receiving, with compressed soft bit circuitry, the set of soft bits. The method includes generating, with the compressed soft bit circuitry and a fixed size soft bit lossy compression algorithm, a fixed size compressed soft bits by compressing the set of soft bits, the fixed size compressed soft bits having a second fixed size that is smaller than the first fixed size. The method also includes outputting, with the compressed soft bit circuitry, the fixed size compressed soft bits to a memory-to-controller bus.

The disclosure also provides an apparatus including, in one embodiment, means for reading a set of hard bits from one or more storage elements, means for sensing a first set of soft bits while reading the set of hard bits from the one or more storage elements, the first set of soft bits having a first fixed size, and each soft bit of the first set of soft bits indicating a reliability of a corresponding hard bit of the set of hard bits, means for generating, with a fixed size soft bit lossy compression algorithm, a fixed size compressed soft bits by compressing the first set of soft bits, the fixed size compressed soft bits having a second fixed size that is smaller than the first fixed size, means for decompressing the fixed size compressed soft bits to determine a second set of soft bits, and means for decoding read data with the second set of soft bits. The second set of soft bits is different than the first set of soft bits.

In this manner, various aspects of the disclosure provide for improvements in at least the technical fields of memory devices and their design and architecture. The disclosure can be embodied in various forms, including hardware or circuits controlled by firmware (i.e., code executing on a processor), computer systems and networks, user interfaces, and application programming interfaces; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the memory device may be performed by hardware (e.g., analog or digital circuits), a combination of hardware and software (e.g., program code or firmware stored in a non-transitory computer-readable medium that is executed by processing or control circuitry), or any other suitable means. The following description is intended solely to give a general idea of various aspects of the disclosure, and does not limit the scope of the disclosure in any way.

Figure 1:
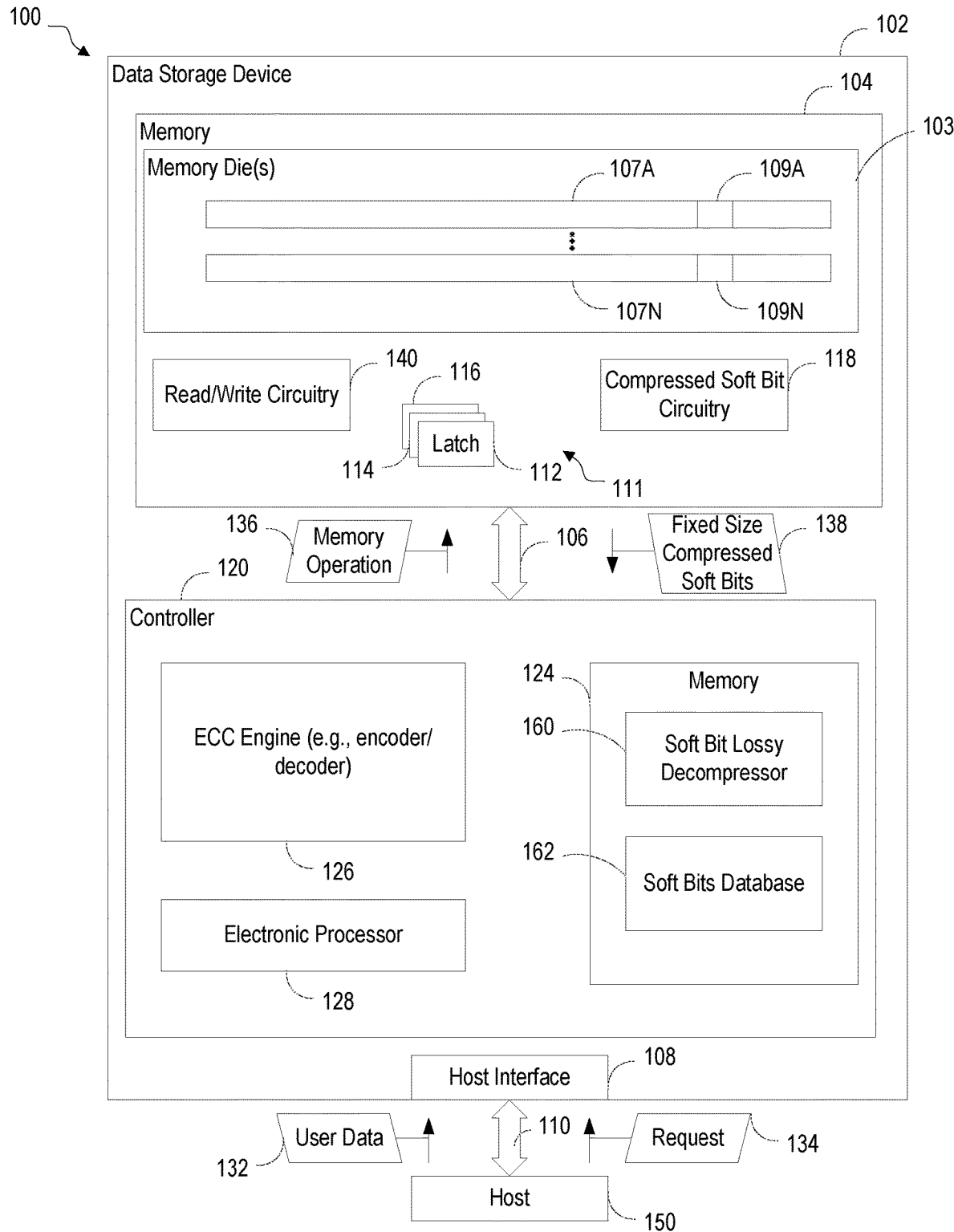
FIG. 1 is block diagram of a system including a data storage device that has fixed size soft bit lossy compression, in accordance with some embodiments of the disclosure.

FIG. 1 is block diagram of a system including a data storage device that has fixed size soft bit lossy compression, in accordance with some embodiments of the disclosure. In the example of FIG. 1, the system 100 includes a data storage device 102 and a host device 150. The data storage device 102 includes a controller 120 and a memory 104 (e.g., non-volatile memory) that is coupled to the controller 120.

One example of the structural and functional features provided by the controller 120 are illustrated in FIG. 1. However, the controller 120 is not limited to the structural and functional features provided by the controller 120 in FIG. 1. The controller 120 may include fewer or additional structural and functional features that are not illustrated in FIG. 1.

The data storage device 102 and the host device 150 may be operationally coupled via a connection (e.g., a communication path 110), such as a bus or a wireless connection. In some examples, the data storage device 102 may be embedded within the host device 150. Alternatively, in other examples, the data storage device 102 may be removable from the host device 150 (i.e., "removably" coupled to the host device 150). As an example, the data storage device 102 may be removably coupled to the host device 150 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 150 via the communication path 110, such as a wired communication path and/or a wireless communication path. For example, the data storage device 102 may include an interface 108 (e.g., a host interface) that enables communication via the communication path 110 between the data storage device 102 and the host device 150, such as when the interface 108 is communicatively coupled to the host device 150.

The host device 150 may include an electronic processor and a memory. The memory may be configured to store data and/or instructions that may be executable by the electronic processor. The memory may be a single memory or may include one or more memories, such as one or more non-volatile memories, one or more volatile memories, or a combination thereof. The host device 150 may issue one or more commands to the data storage device 102, such as one or more requests to erase data at, read data from, or write data to the memory 104 of the data storage device 102. For example, the host device 150 may be configured to provide data, such as user data 132, to be stored at the memory 104 or to request data to be read from the memory 104. The host device 150 may include a mobile smartphone, a music player, a video player, a gaming console, an electronic book reader, a personal digital assistant (PDA), a computer, such as a laptop computer or notebook computer, any combination thereof, or other suitable electronic device.

The host device 150 communicates via a memory interface that enables reading from the memory 104 and writing to the memory 104. In some examples, the host device 150 may operate in compliance with an industry specification, such as a Universal Flash Storage (UFS) Host Controller Interface specification. In other examples, the host device 150 may operate in compliance with one or more other specifications, such as a Secure Digital (SD) Host Controller specification or other suitable industry specification. The host device 150 may also communicate with the memory 104 in accordance with any other suitable communication protocol.

The memory 104 of the data storage device 102 may include a non-volatile memory (e.g., NAND, BiCS family of memories, or other suitable memory). In some examples, the memory 104 may be any type of flash memory. For example, the memory 104 may be two-dimensional (2D) memory or three-dimensional (3D) flash memory. The memory 104 may include one or more memory dies 103. Each of the one or more memory dies 103 may include one or more blocks (e.g., one or more erase blocks). Each block may include one or more groups of storage elements, such as a representative group of storage elements 107A-107N. The group of storage elements 107A-107N may be configured as a word line. The group of storage elements 107 may include multiple storage elements (e.g., memory cells that are referred to herein as a "string"), such as a representative storage elements 109A and 109N, respectively.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to the one or more memory dies 103 of the memory 104. Alternatively, one or more individual memory dies may include corresponding read/write circuitry that is operable to read from and/or write to storage elements within the individual memory die independent of any other read and/or write operations at any of the other memory dies.

The memory 104 may further include one or more latches (e.g., a set of latches 111 including latches 112, 114, and 116) and compressed soft-bit (CSB) circuitry 118. In some examples, one or more CSB operations may be performed using the read/write circuitry 140. The memory array 104, the read/write circuitry 140, the CSB circuitry 118 may be integrated within a memory die of the memory 104. In one example, the CSB circuitry 118 is replicated and a part of each memory die either by integrating the CSB circuitry 118 with the memory die or by bonding dies including the CSB circuitry to respective memory dies. The CSB circuitry 118 may be coupled to one or more of the memory array 104, the read/write circuitry 140, one or more of the latches 112, 114, and 116, or a connection between the memory 104 and the controller 120, such as a memory-to-controller bus 106.

The CSB circuitry 118 may include one or more logic gates, such as one or more AND logic gates. Alternatively or additionally, the CSB circuitry 118 may include one or more other logic gates, for example, one or more OR logic gates, one or more exclusive-OR (XOR) logic gates, one or more inverter (NOT) logic gates, one or more NOT-AND (NAND) logic gates, one or more NOT-OR (NOR) logic gates, one or more exclusive-NOR (XNOR) gates, one or more other logic gates, or a combination thereof. In other examples, the CSB circuitry 118 may be omitted from the memory 104, and operations described with reference to the CSB circuitry 118 may be performed at the latches 112, 114, and 116 (e.g., using logical operations performed at the latches 112, 114, and 116).

The data storage device 102 includes the controller 120 coupled to the memory 104 (e.g., the one or more memory dies 103) via a bus 106, an interface (e.g., interface circuitry), another structure, or a combination thereof. For example, the bus 106 may include multiple distinct channels to enable the controller 120 to communicate with each of the one or more memory dies 103 in parallel with, and independently of, communication with the other memory dies 103. In some implementations, the memory 104 may be a flash memory.

The controller 120 is configured to receive data and instructions from the host device 150 and to send data to the host device 150. For example, the controller 120 may send data to the host device 150 via the interface 108, and the controller 120 may receive data from the host device 150 via the interface 108. The controller 120 is configured to send data and commands (e.g., the memory operation 136) to the memory 104 and to receive data and fixed size compressed soft bits from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data.

The controller 120 is configured to send a read command to the memory 104 to access data from a specified address of the memory 104. The read command may specify the physical address of a region of the memory 104 (e.g., a physical address of a word line of the memory 104). The controller 120 may also be configured to send data and commands to the memory 104 associated with background scanning operations, garbage collection operations, and/or wear-leveling operations, or other suitable memory operations.

The controller 120 may include a memory 124, an error correction code (ECC) engine 126, and an electronic processor 128. The memory 124 may be configured to store data and/or instructions that may be executable by the electronic processor 128. The memory 124 may include soft bit lossy decompressor 160 and soft bits database 162. The soft bit lossy decompressor 160 may be a hardware circuit or instructions that are executable by the electronic processor 128.

The controller 120 may send the memory operation 136 (e.g., a read command) to the memory device 104 to cause the read/write circuitry 140 to sense data stored in a storage element. For example, the controller 120 may send the read command to the memory device 104 in response to receiving a request for read access from the host device 150. In response to receiving the read command, the memory device 104 may sense the storage region 107A (e.g., using the read/write circuitry 140) to generate one or more sets of bits, such as a set of hard bits representing the data and a set of soft bits. The set of soft bits may indicate reliability information useable by the ECC engine 126 during decoding of the corresponding set of hard bits.

The set of hard bits may represent a single logical page or one or more logical pages. The set of soft bits may represent a corresponding single logical page or a corresponding one or more logical pages.

The compressed soft bit (CSB) circuitry 118 allows defined memory spaces, such as pages, to be split into smaller fixed size segments. For example, the fixed size soft bit lossy compression described in FIG. 6 allows the memory controller 120 to read data from the defined memory spaces, i.e., the pages split into 64-bit fixed size segments because the CSB circuitry 118 compresses soft bits corresponding to the 64-bit fixed size segments to an even smaller fixed size (e.g. 12 bits). This splitting of the defined memory spaces simplifies and increases the efficiency of the read operations of the memory controller 120 and the compressed soft bits decreases the necessary bus width for performing read operations with soft bits.

The compressed soft bit (CSB) circuitry 118 also allows for lossy compression to be performed in a distributed manner. For example, the latches 116 and the CSB circuitry 118 may perform the fixed size lossy compression described in FIGS. 2-10, separately or in combination with each other (e.g., parallel, staggered, or other suitable combination).

Figure 2:
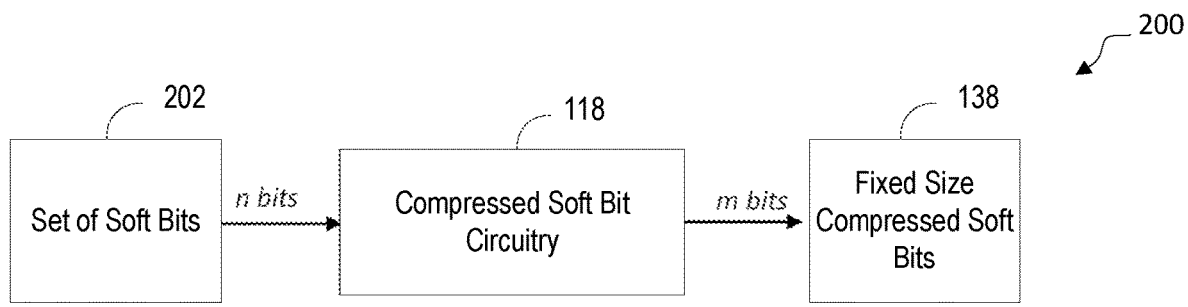
FIG. 2 is a block diagram illustrating fixed size soft bit lossy compression of compressed soft bit (CSB) circuitry, in accordance with various aspects of the present disclosure.

FIG. 2 is a block diagram illustrating fixed size soft bit lossy compression of the compressed soft bit (CSB) circuitry 118, in accordance with various aspects of the present disclosure. The CSB circuitry 118 compresses a vector of fixed size n, containing up to t unreliable soft-bits to fixed size m as long as the following condition (1) is met:

$$2^m \geq \sum_{i=0}^{t} \binom{n}{i} \quad (1)$$

The condition (1) assumes that in each vector of size fixed size n, only a small amount of bits are unreliable. The reliable/unreliable bits may be marked as "0" or "1" in a binary representation. Assuming the condition (1) is met, then m bits are enough to code up to t marked bits in a vector of size n. If there are more than t marked bits, the excess beyond t is discarded as part of the "lossy" compression. Depending on the exact values, of m, t, n, and the reliability of the hard bits read from the memory, this lossy compression method can successfully code the locations of all or most of the unreliable bits in the page. The resulting compression ratio is m/n, while the higher the t, more marked bits are kept and the quality of the compression is improved. For example, assuming n=64, t=2, and m=12, then the above condition (1) is as follows:

$$2^{12} = 4096 > \binom{64}{0} + \binom{64}{1} + \binom{64}{2} = 1 + 64 + 2016 = 2081$$

As illustrated in FIG. 2, the CSB circuitry 118 is configured to perform lossy compression using the set of soft bits (i.e., a fixed size vector of n) to generate the fixed size compressed soft bits 138 (i.e., a fixed size of m bits). For example, the CSB circuitry 118 may perform one or more operations to compress the set of soft bits to generate the fixed size compressed soft bits 138 in accordance with a lossy soft bit compression scheme as described below with respect to FIGS. 3-10.

In some examples, the fixed size compressed soft bits 138 may have a fixed size of m bits that is based on a width of the memory-to-controller bus 106, for example, the fixed size compressed soft bits 138 may be an integer multiple of the bus width or the bus width may be an integer multiple of the fixed size compressed soft bits 138. For example, the fixed size compressed soft bits 138 may have a fixed size of 12 bits when the width of the memory-to-controller bus 106 is 144 bits.

In a first example of FIG. 1, the CSB circuitry 118 may be coupled to the read/write circuitry 140 and to one or more of the latches 112-116. In this example, the CSB circuitry 118 is configured to receive the set of soft bits from the read/write circuitry 140 and to provide the fixed size compressed soft bits 138 to one or more of the latches 112-116 based on the set of soft bits.

In a second example of FIG. 1, the CSB circuitry 118 may be coupled to one or more of the latches 112-116 and to a connection between the memory 104 and the controller 120 (e.g., the memory-to-controller bus 106). In this example, the CSB circuitry 118 may be configured to receive the set of soft bits from one of the latches 112-116 and to provide the fixed size compressed soft bits 138 to the controller 120 using the memory-to-controller bus 106.

In a third example, soft bit operations may be performed at the latches 112-116. In this example, soft bit compression may be enabled using latch-based commands from the controller 120 (e.g., by using commands that cause the memory device 104 to perform logical operations at the latches 112-116, such as AND operations, OR operations, or other logical operations). In some examples, the CSB circuitry 118 may be omitted from the memory 104 by not including the CSB circuitry 118 in the memory 104 and the latches 111 may be used to perform operations described with reference to the CSB circuitry 118.

The controller 120 may receive the set of hard bits and the fixed size compressed soft bits 138 from the memory 104. The controller 120 may input the set of hard bits to the ECC engine 126 to initiate a decoding process that decodes the set of hard bits using the fixed size compressed soft bits 138. The controller 120 may also input the fixed size compressed soft bits 138 to the soft bits database 162 to initiate a decompression process that decompresses the fixed size compressed soft bits 138 with the soft bit lossy decompressor 160. For example, the electronic processor 128 may generate a fixed size uncompressed soft bits based on the fixed size compressed soft bits 138 and the soft bit lossy decompressor 160. The electronic processor 128 may also control the memory 124 to store the fixed size uncompressed soft bits in the soft bits database 162. The fixed size uncompressed soft bits may indicate reliabilities associated with the set of hard bits that were received by the controller 120. For example, a particular value of the fixed size uncompressed soft bits may indicate a likelihood that a corresponding bit of the set of hard bits has a reliable binary value or an unreliable binary value.

Figure 3:
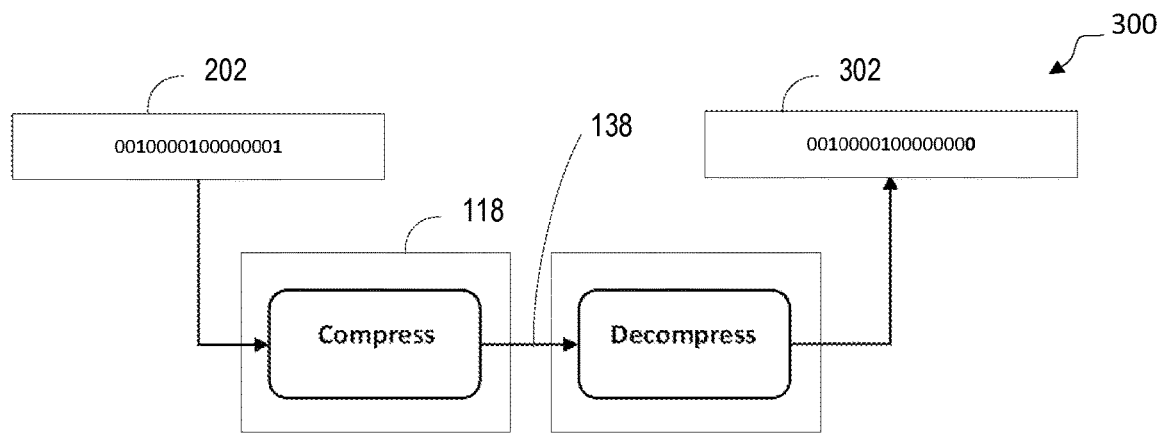
FIG. 3 is a flow diagram illustrating a first example of undermarking in the fixed size soft bit lossy compression of FIG. 1, in accordance with various aspects of the present disclosure.

FIG. 3 is a flow diagram illustrating a first example 300 of undermarking in the fixed size soft bit lossy compression of FIG. 1, in accordance with various aspects of the present disclosure. FIG. 3 is described with respect to FIGS. 1 and 2.

In the example of FIG. 3, the set of soft bits 202 is "0010000100000001" and is compressed by the compressed soft bit circuitry 118 to generate the fixed size compressed soft bits 138, where t marked bits is 2. The fixed size compressed soft bits 138 is decompressed by the electronic processor 128 with the soft bit lossy decompressor 160 to generate a second set of soft bits 302. In the example of FIG. 3, the second set of soft bits 302 is "0010000100000000," which is different from set of soft bits 202 because the second set of soft bits 302 is "undermarked" with respect to the set of soft bits 202 as the maximum number of available marked bits is 2.

Figure 4:
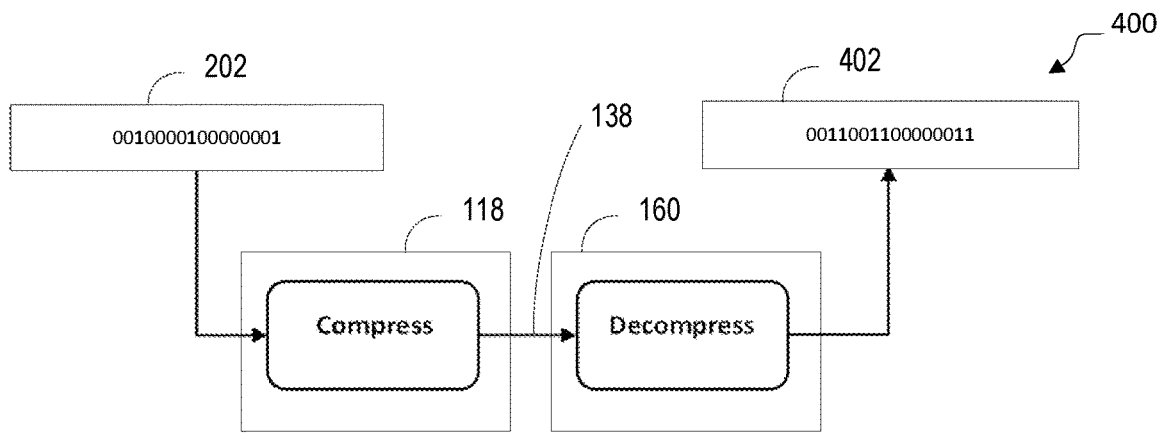
FIG. 4 is a flow diagram illustrating an example of overmarking in the fixed size soft bit lossy compression of FIG. 1, in accordance with various aspects of the present disclosure.

FIG. 4 is a flow diagram illustrating an example 400 of overmarking in the fixed size soft bit lossy compression of FIG. 1, in accordance with various aspects of the present disclosure. FIG. 4 is described with respect to FIGS. 1 and 2.

In the example of FIG. 4, t bits are marked with fewer bits (i.e., a lower compressed size m) at the expense of marking "more" bits, which is referred to as "overmarking." Overmarking may be beneficial for the performance of the ECC engine 126 because the penalty for marking a reliable bit as unreliable may be smaller than the penalty for marking an unreliable bit as reliable.

The overmarking occurs by marking the locations of pairs, triplets, or any suitable k-tuple. In other words, for each marked bit location in the set of soft bits 202, the adjacent bits in the k-tuple are also marked. For example, if the overmarking is done in pairs, then there are only n/2 possible pair locations. In general, when overmarking the location of k-tuples, then there are only n/k such tuple location in the n-bit input vector. Therefore, the condition for m, the size of the compressed vectors is condition (2):

$$2^m \geq \sum_{i=0}^{t} \binom{n/k}{i} \quad (2)$$

Compared to condition (1), the above condition (2) allows compression for lower m or higher t. However, more bits are "overmarked" meaning that reliable bits are marked as unreliable.

In the example of FIG. 4, the set of soft bits 202 is "0010000100000001" and is compressed by the compressed soft bit circuitry 118 to generate the fixed size compressed soft bits 138, where t marked bits is 3 and k=2. The fixed size compressed soft bits 138 is decompressed by the electronic processor 128 with the soft bit lossy decompressor 160 to generate a second set of soft bits 402. In the example of FIG. 4, the second set of soft bits 302 is "0011000110000011," which is different from set of soft bits 202 because the second set of soft bits 402 is "overmarked" with respect to the set of soft bits 202 as pairs (k=2) are being marked.

Figure 5:
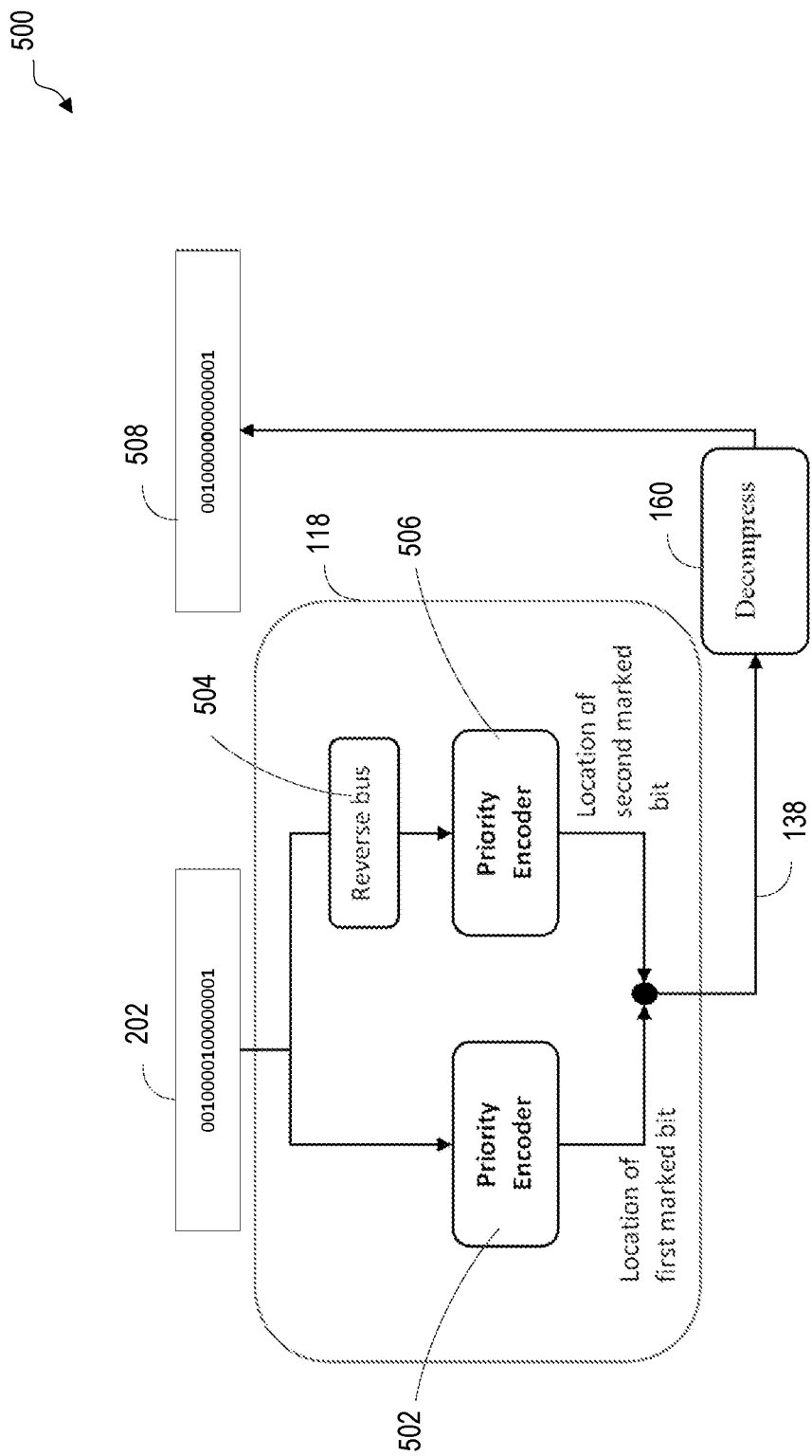
FIG. 5 is a flow diagram illustrating a second example of undermarking in the fixed size soft bit lossy compression of FIG. 1, in accordance with various aspects of the present disclosure.

FIG. 5 is a flow diagram illustrating a second example 500 of undermarking in the fixed size soft bit lossy compression of FIG. 1, in accordance with various aspects of the present disclosure. FIG. 5 is described with respect to FIGS. 1 and 2.

As illustrated in FIG. 5, the second example 500 is a specific compressor implementation for two marked bits (t=2) that is efficient and suitable for hardware implementation as the CSB circuitry 118. This implementation has two "priority encoders" 502 and 506. Encoders 502 and 506 each output the location (index) of the first "1" in the set of soft bits 202. Alternatively, in other implementations marking unreliable bits as "0," encoders 502 and 506 each output the location (index) of the first "0" in the set of soft bits 202.

The encoder 502 uses the set of soft bits 202 from least significant bit (LSB) to most significant bit (MSB). The encoder 506 receives the reverse of the set of soft bits 202 from the reverse bus 504, i.e., the set of soft bits 202 from MSB to LSB. The encoders 502 and 506 each will encode the location of a marked bit from the end of the input vector. Alternatively, in other implementations, the encoders 502 and 506 each may encode the location of a marked bit from the beginning of the input vector.

For example, when only one marked bit is in the input vector, then either the encoder 502 or the encoder 506 will use a "null" value for one of the indices. In a different example, when no marked bits are in the input vector, then the encoder 502 and the encoder 506 will each use a "null" value. The null value may be any predetermined value, though all "0" or all "1" binary representation values are the most convenient representation of null values.

The encoders 502 and 506 each need one null value and n−1 values for n−1 possible locations. The last location does not need to be covered as the last location is covered by the other encoder. Therefore, each encoder needs n values to cover all possibilities, which may be coded with $2\lceil \log_2 n \rceil$ bits, which includes a round up operation. Additionally, in the case that $m \geq 2\lceil \log_2 n \rceil$, then there are sufficient bits to cover all input vectors with up to two marked bits. Otherwise, only a subset of possible vectors may be covered. For example, if n=64 and with only m=10 bits (5 bit for each index), the each encoder may cover bits 0-30 from each end of the vector. For example, if an input vector has two marked bits at indices 1,2 then the first encoder will mark the first index, however, the second one will not covered and will be discarded. In this case, when $m < 2\lceil \log_2 n \rceil$ the compressor cannot cover all input vectors with two marked bits. However, if m=12 bits, then all possible input vectors with two marked bits may be covered. With this implementation, the CSB circuitry 118 allows for parallel implementation, low latency, and low cost. In any case, only two marked bits, at most, may be covered and the rest are discarded.

The second example 500 may also be generalized to overmarking as well. For example, by having the encoders 502 and 506 identify the leading k-tuple containing a marked bit, and the marking location of the entire k-tuple, then k=1 is similar to the scheme described above. This may be done by a performing a logical 'OR' operation between the bits in each k-tuple and then using the same compressor circuit illustrated in FIG. 5. In this case, however, the value of m may be smaller, e.g., the condition for covering all input vectors with two marked bits is looser $m \geq 2\lceil \log_2 n/k \rceil$.

Figure 6:
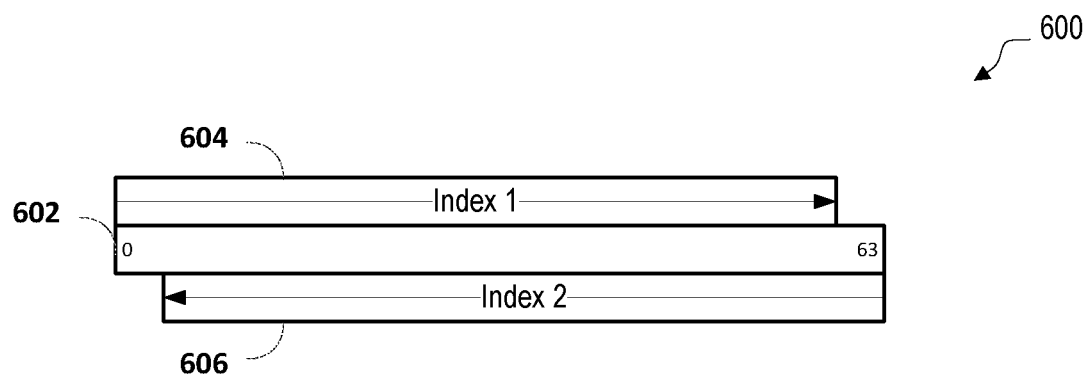
FIG. 6 is a diagram illustrating a first example of the fixed size soft bit lossy compression of FIG. 5, in accordance with some embodiments of the disclosure.

FIG. 6 is a diagram illustrating a first example 600 of the fixed size soft bit lossy compression of FIG. 5, in accordance with some embodiments of the disclosure. In the example of FIG. 6, n=64, m=12, and t=2, which represents a compression of 64 bits to 12 bits, i.e., a compression ratio of 18.75%. Therefore, as $m=2 \log_2 n=12$, then the first example 600 of the fixed size soft bit lossy compression of FIG. 6 may cover all possibilities with up to two marked bits, i.e., t=2. However, any marked bits greater than 2 in the set of soft bits 602 will not be recovered during the decompress operation 160.

As illustrated in FIG. 6, the set of soft bits 602 (similar to the set of soft bits 202 as described above) is 64 bits and any two marked bits (e.g., marked "1" bits) may be captured every 64 bits. Additionally, in some examples, the first index 604 may be a first 6 bit index that marks the first "1" from the LSB to MSB except for the $64^{th}$ bit. Further, in some examples, the second index 606 may be a second 6 bit index that marks the second "1" from the MSB to the LSB except for the $64^{th}$ bit. The $64^{th}$ bit may be the "null" bit location, i.e., an indication that there are no marked bits in the set of soft bits 602. The first index 604 in combination with the second index 606 is an example of the fixed size compressed soft bits 138.

Figure 7:
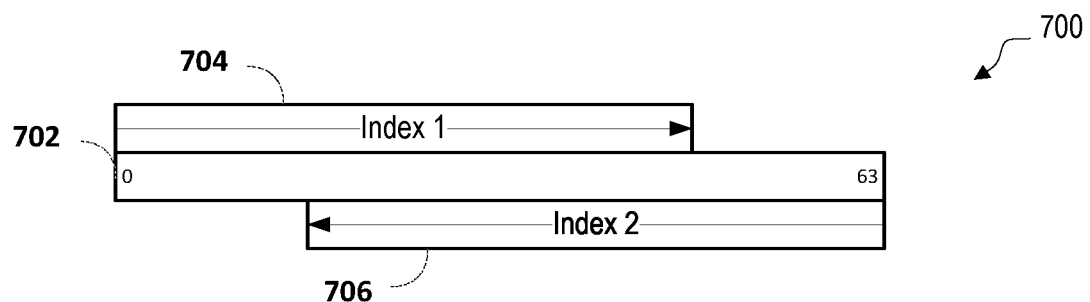
FIG. 7 is a diagram illustrating a second example of the fixed size soft bit lossy compression of FIG. 5, in accordance with some embodiments of the disclosure.

FIG. 7 is a diagram illustrating a second example 700 of the fixed size soft bit lossy compression of FIG. 5, in accordance with some embodiments of the disclosure. In the example of FIG. 7, n=72, m=12, and t=2, which represents a compression of 72 bits to 12 bits, i.e., a compression ratio of 16.67%. Therefore, the condition $m \geq 2\lceil \log_2 n \rceil$ is not met, then the second example 700 of the fixed size soft bit lossy compression of FIG. 7 may cover all possibilities with no marked bits and a single marked bit, but only a subset of the possibilities with two marked bits, i.e., t=2. Additionally, any marked bits greater than 2 in the set of soft bits 702 will not be recovered during the decompress operation 160.

As illustrated in FIG. 7, the set of soft bits 702 (similar to the set of soft bits 202 as described above) is 72 bits and a subset of up to two marked bits (e.g., marked "1" bits) may be captured every 72 bits. Additionally, in some examples, the first index 704 may be a first 6 bit index that marks the first "1" from the LSB to MSB except for the $64^{th}$ bit. Further, in some examples, the second index 706 may be a second 6 bit index that marks the second "1" from the MSB to the LSB except for the $64^{th}$ bit. The $64^{th}$ bit may be the "null" bit location, i.e., an indication that there are no marked bits in the set of soft bits 702. The first index 704 in combination with the second index 706 is an example of the fixed size compressed soft bits 138.

Figure 8:
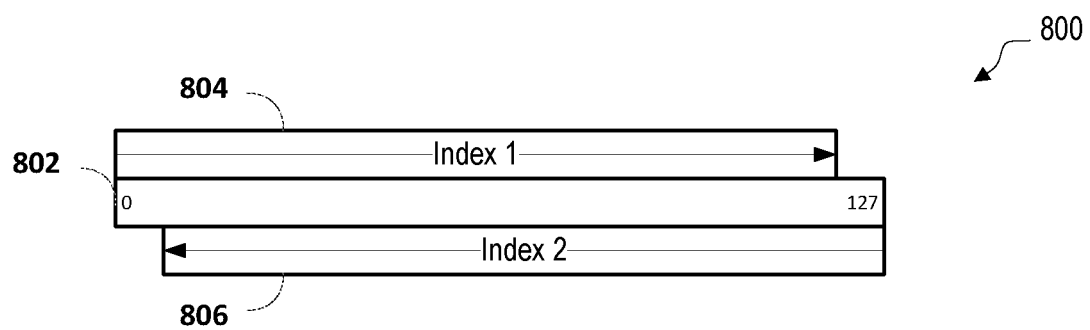
FIG. 8 is a diagram illustrating a third example of the fixed size soft bit lossy compression of FIG. 5, in accordance with some embodiments of the disclosure.

FIG. 8 is a diagram illustrating a third example 800 of the fixed size soft bit lossy compression of FIG. 5, in accordance with some embodiments of the disclosure. In the example of FIG. 8, n=128, m=14, and t=2, which represents a compression of 128 bits to 14 bits, i.e., a compression ratio of 10.9%. Therefore, as m=2 $\log_2$ n=14, then the third example 800 of the fixed size soft bit lossy compression of FIG. 8 may cover all possibilities with two marked bits, i.e., t=2. However, any marked bits greater than 2 in the set of soft bits 802 will not be recovered during the decompress operation 160.

As illustrated in FIG. 8, the set of soft bits 802 (similar to the set of soft bits 202 as described above) is 128 bits and up to two marked bits (e.g., marked "1" bits) may be captured every 128 bits. Additionally, as illustrated in FIG. 8, the first index 804 is a first 7 bit index that marks the first "1" from the LSB to MSB except for the $128^{th}$ bit. Further, as illustrated in FIG. 8, the second index 806 is a second 7 bit index that marks the second "1" from the MSB to the LSB except for the 128th bit. The $128^{th}$ bit may be the "null" bit location, i.e., an indication that there are no marked bits in the set of soft bits 802. The first index 804 in combination with the second index 806 is an example of the fixed size compressed soft bits 138.

Figure 9:
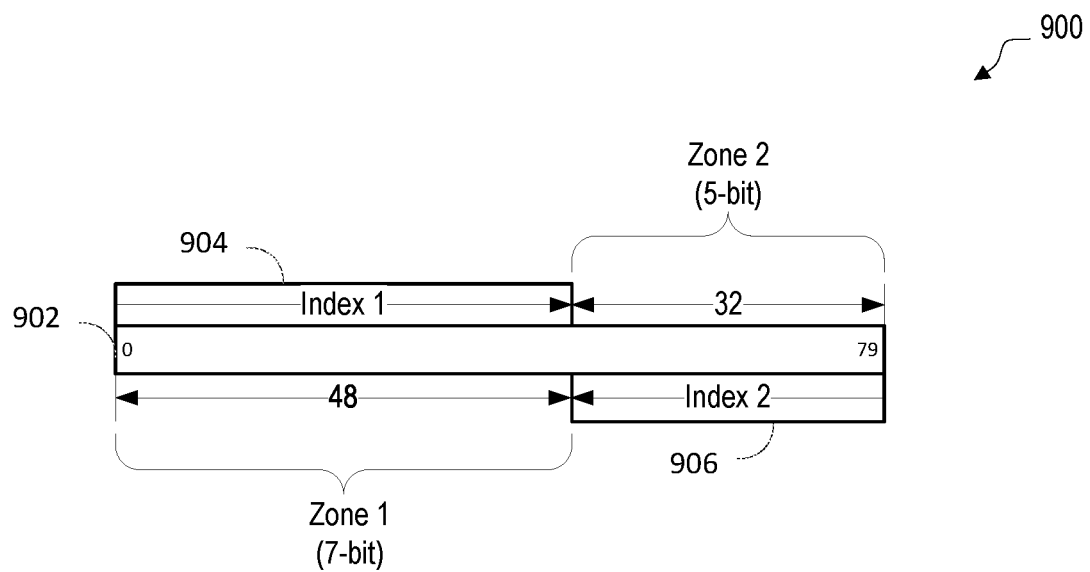
FIG. 9 is a diagram illustrating a fourth example of the fixed size soft bit lossy compression of FIG. 1, in accordance with some embodiments of the disclosure.

FIG. 9 is a diagram illustrating a fourth example 900 of the fixed size soft bit lossy compression of FIG. 1, in accordance with some embodiments of the disclosure. In the example of FIG. 9, n=80, m=12, and t=2, which represents a compression of 80 bits to 12 bits, i.e., 15%.

As illustrated in FIG. 9, the set of soft bits 902 (similar to the set of soft bits 202 as described above) is 80 bits and up to two marked bits (e.g., marked "1" bits) may be captured every 80 bits. However, any marked bits greater than 2 in the set of soft bits 902 will not be recovered during the decompress operation 160.

Further, as illustrated in FIG. 9, the set of soft bits 902 is divided into two zones. Zone 1 corresponds to a first index 904 and Zone 2 corresponds to a second index 906. In the example of FIG. 9, the first index 904 may be 7-bits and the second index 906 may be 5-bits.

In the example of FIG. 9, the marking of each index 904, 906 depends on the amount of marked bits 0, 1, or 2 and the amount in each zone. The first index 904 in combination with the second index 906 is an example of the fixed size compressed soft bits 138. However, the fourth example 900 is not limited to each index 904, 906 being exactly associated with each Zone 1 and Zone 2, respectively, as illustrated in FIG. 9. The fourth example 900 of the fixed size soft bit lossy compression of FIG. 1 may also be implemented when each index 904, 906 is not exactly associated with each Zone 1 and Zone 2, respectively.

With up to two marked bits, there are six different cases with respect to their location in Zone 1 and Zone 2 in the fourth example 900. In a first case, there are no marked bits in Zone 1 and Zone 2. In this case, the first index 904 indicates "80" (i.e., 1010000) and the second index 906 indicates "31" (i.e., 11111).

In a second case, there is a marked bit in Zone 1 and there are no marked bits in Zone 2. In this case, the first index 904 indicates the position of the marked bit in the 48 locations with "80-127" (i.e., 1010000-1111111) and the second index 906 indicates "30" (i.e., 11110).

In a third case, there are no marked bits in Zone 1 and there is a marked bit in Zone 2. In this case, the first index 904 indicates the position of the marked bit in the 32 locations of Zone 2 with "80-111" (i.e., 1010000-1101111) and the second index 906 indicates "29" (i.e., 11101) or any value between "24-31" because the second index 906 values 24-31 are unused and any of them may be used to mark the third case.

In a fourth case, there is a first marked bit in Zone 1 and a second marked bit in Zone 2. In this case, the first index 904 indicates the position of the first marked bit in the 48 locations of Zone 1 with "0-47" (i.e., 0000000-0101111) and the second index 906 indicates the position of the second marked bit in the 32 locations of Zone 2 with "0-31" (i.e., 00000-11111).

In a fifth case, there are no marked bits in Zone 1 and there are two marked bits in Zone 2. In this case, the first index 904 indicates the position of the first marked bit in the 32 locations of Zone 2 with "48-79" (i.e., 0110000-1001111) and the second index 906 indicates the position of the second marked bit in the 32 locations of Zone 2 with "0-31" (i.e., 00000-11111).

In a sixth case, there are two marked bits in Zone 1 and there are no marked bits in Zone 2. In this case, the first index 904 indicates the position of one of the marked bits in the 48 locations of Zone 1 with "80-127" (i.e., 1010000-1111111) and the second index 906 indicates the offset of the other marked bits position from the first marked bits position in Zone 1 minus 1 with values "0-23" (i.e., 00000-10111). The marked bit chosen to be indicated by the first index 904 is the marked bits from which the offset to the other marked bit is smaller and therefore the offset is value is between 0-23. This assumes that values index values are cyclical, e.g. values are calculated modulo 48.

In the sixth case, denote L low and L high the locations of the first and second marked bits in Zone 1, respectively, and where the first one has lower value position and the second one has a higher value position. Then the CSB circuitry 118 of FIG. 1 calculates the first index 904 and the second index 906 according to a difference D. If the difference D, which is equal to L high−L low, is less than 24, then the first index 904 will indicate the position of L low with a value equal to 80+L low and the second index 906 is equal to the difference D−1. If the difference D, is equal to or greater than 24, then the first index 904 will indicate the position of L high with a value equal to 80+L high and the second index 906 is equal to 47−D.

In a first example of the sixth case, the first marked bit is at location "0" and the second marked bit is at location "1." In this example, the difference D is equal to 1−0 or 1. Therefore, the first index 904 is equal to 80 (80±0) and the second index 906 is equal to 0 (1−1).

In a second example of the sixth case, the first marked bit is at location "2" and the second marked bit is at location "25." In this example, the difference D is equal to 25−2 or 23. Therefore, the first index 904 is equal to 82 (80+2) and the second index 906 is equal to 22 (23−1).

In a third example of the sixth case, the first marked bit is at location "2" and the second marked bit is at location "26." In this example, the difference D is equal to 26−2 or 24. Therefore, the first index 904 is equal to 106 (80+26) and the second index 906 is equal to 23 (47−24).

In a fourth example of the sixth case, the first marked bit is at location "0" and the second marked bit is at location "47." In this example, the difference D is equal to 47−0 or 47. Therefore, the first index 904 is equal to 127 (80+47) and the second index 906 is equal to 0 (47−47).

In a fifth example of the sixth case, the first marked bit is at location "10" and the second marked bit is at location "40." In this example, the difference D is equal to 40−10=30. Therefore, the first index 904 is equal to 120 (80+40) and the second index 906 is equal to 17 (47−30).

The decompressor 160 will recover the soft bit data according to: L1=the first index 904−80 and L2=(L1+the second index 906+1) modulo 48. With respect to the fifth example of the sixth case, L1=120−80=40 and L2=(40+17+1) modulo 48=10.

Figure 10:
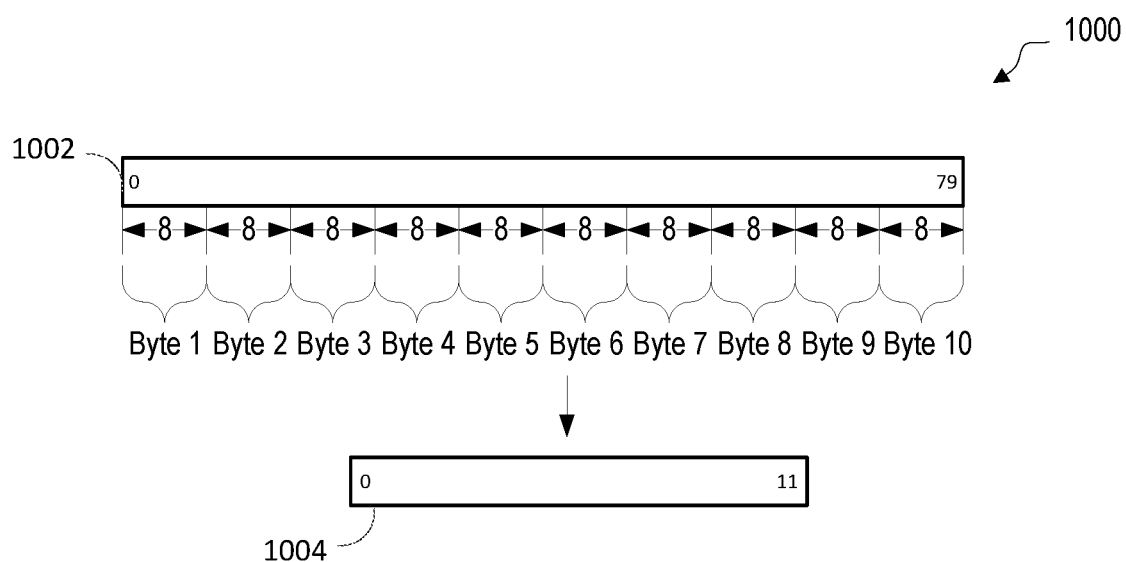
FIG. 10 is a diagram illustrating a fifth example of the fixed size soft bit lossy compression of FIG. 1, in accordance with some embodiments of the disclosure.

FIG. 10 is a diagram illustrating a fifth example 1000 of the fixed size soft bit lossy compression of FIG. 1, in accordance with some embodiments of the disclosure. In the example of FIG. 10, n=80, m=12, and t=2, which represents a compression of 80 bits to 12 bits, i.e., a compression ratio of 15%.

As illustrated in FIG. 10, the set of soft bits 1002 (similar to the set of soft bits 202 as described above) is 80 bits and up to two marked bits (e.g., marked "1" bits) may be captured every 80 bits. However, any marked bits greater than 2 in the set of soft bits 1002 will not be recovered during the decompress operation 160. Further, as illustrated in FIG. 10, the set of soft bits 1002 is divided into 10 bytes, and each byte includes 8 bits. In this example, only one marked bit per byte may be captured. However, any marked bits greater than one in each byte will not be recovered during the decompress operation 160. This example is more limited than the fourth example 1000 of the fixed size soft bit lossy compression of FIG. 1, however it simplifies the implementation.

In the example of FIG. 10, the two marked bits are indicated by 12 bits, i.e., a fixed size compressed soft bits 1004 (similar to the fixed size compressed soft bits 138 described above) that have the following format: 1) 6 bits for indicating the location of up to two bytes, 2) 3 bits indicating the location of the marked bit within the first byte, and 3) 3 bits indicating the location of the marked bit within the second byte. The location of two bytes out of 10 bytes (i.e., 80 bits) will be coded within 6 bits according to Table 1 below and the 10 bytes will be divided into the first seven bytes and the last three bytes.

TABLE 1

| | Byte Coding | | | | | | | | | |
|---|---|---|---|---|---|---|---|---|---|---|
| Byte | 1 | 2 | 3 | 4 | 5 | 6 | 7 | 8 | 9 | 10 |
| Coding A | 1 | 2 | 3 | 4 | 5 | 6 | 7 | 1 | 2 | 3 |
| Coding B | 9 | 10 | 11 | 12 | 13 | 14 | 15 | | | |

There are six different cases with respect to the 10 bytes in the fifth example 1000. In a first case, there are no marked bits. In this case, out of the 12 bits, the first four bits (location of the first byte) is "0" (i.e., 0000) and the last two bits (location of second byte) is "0" (i.e., 00).

In a second case, there is marked bit in a first byte from the first seven bytes and there are no marked bits in the other three bytes. In this case, out of the 12 bits, the first four bits (location of the first byte) is "1-7" (i.e., 0001-0111) and the last two bits (location of second byte) is "0" (i.e., 00).

In a third case, there is no marked bit in the first seven bytes and there is a marked bit in the last three bytes. In this case, out of the 12 bits, the first four bits (location of the first byte) is "0" (i.e., 0000) and the last two bits (location of second byte) is "1-3" (i.e., 01-11).

In a fourth case, there is marked bit in a first byte from the first seven bytes and there is a marked bit in a second byte from the last three bytes. In this case, out of the 12 bits, the first four bits (location of the first byte) is "1-7" (i.e., 0001-0111) and the last two bits (location of second byte) is "1-3" (i.e., 01-11).

In a fifth case, there are no marked bits in the first seven bytes and there are two marked bits in the last three bytes. In this case, out of the 12 bits, the first four bits (location of the first byte) is "8" (i.e., 1000) and the last two bits (location of second byte) is "1-3" (i.e., 01-11). However, in this case, the "1-3" follows the coding: 1=110, 2=011, and 3=101. In other words, in this case a "1" means the first and second bytes of the last three bytes are assumed to include a marked bit. Likewise, a "2" means the second and third bytes of the last three bytes are assumed to include a marked bit. Lastly, a "3" means the first and third bytes of the last three bytes are assumed to include a marked bit.

In a sixth case, there are two marked bits in the first seven bytes and there are no marked bits in the last three bytes. In this case, out of the 12 bits, the first four bits (location of the first byte) is "9-15" (i.e., 1001-1111) and represents bytes 1-7. Additionally, in this case, the last two bits (location of second byte) is "1-3" (i.e., 01-11) and represents the delta from the first byte interpreted cyclically modulo 7, and the delta must be 3 or less.

In a first example of the sixth case, the first marked bit may be at byte "2" and the second marked bit may be at byte "5." In this example, the first marked bit at byte "2" is coded as "10" because the first four bits are in the Coding B row of Table 1. Additionally, in this example, the second marked bit at byte "5" is coded as "3" because "3" is the delta between byte "5" and byte "2." Therefore, the four bits are "10" (i.e., 1010) and the last two bits are "3" (i.e., 11).

In a second example of the sixth case, the first marked bit may be at byte "2" and the second marked bit may be at byte "6." In this example, the first marked bit at byte "6" is coded as "14" because the delta between 6 and 2 is greater than 3 and the first four bits are in the Coding B row of Table 1. Additionally, in this example, the second marked bit at byte "2" is coded as "3" because "3" is the delta interpreted cyclically between byte "6" and byte "2." Therefore, the four bits are "10" (i.e., 1110) and the last two bits are "3" (i.e., 11).

In a third example of the sixth case, the first marked bit may be at byte "1" and the second marked bit may be at byte "7." In this example, the first marked bit at byte "7" is coded as "15" because the delta between 7 and 1 is greater than 3 and the first four bits are in the Coding B row of Table 1. Additionally, in this example, the second marked bit at byte "1" is coded as "1" because "1" is the delta interpreted cyclically between byte "7" and byte "1." Therefore, the four bits are "15" (i.e., 1111) and the last two bits are "1" (i.e., 01).

Additionally, while FIG. 10 is described with respect to 80 to 12 compression, FIG. 10 is not limited to just 80 to 12 compression. The compression technique described in FIG. 10 may be applied to other compressions. For example, the compression technique described in FIG. 10 may be applied to 72 to 12 compression in the event the bit bus is a 144 bit bus.

The fixed size segments lossy compression methods described above are only examples that illustrate the advantages of the present disclosure. Other similar lossy compression methods are in the scope of the present disclosure.

Figure 11:
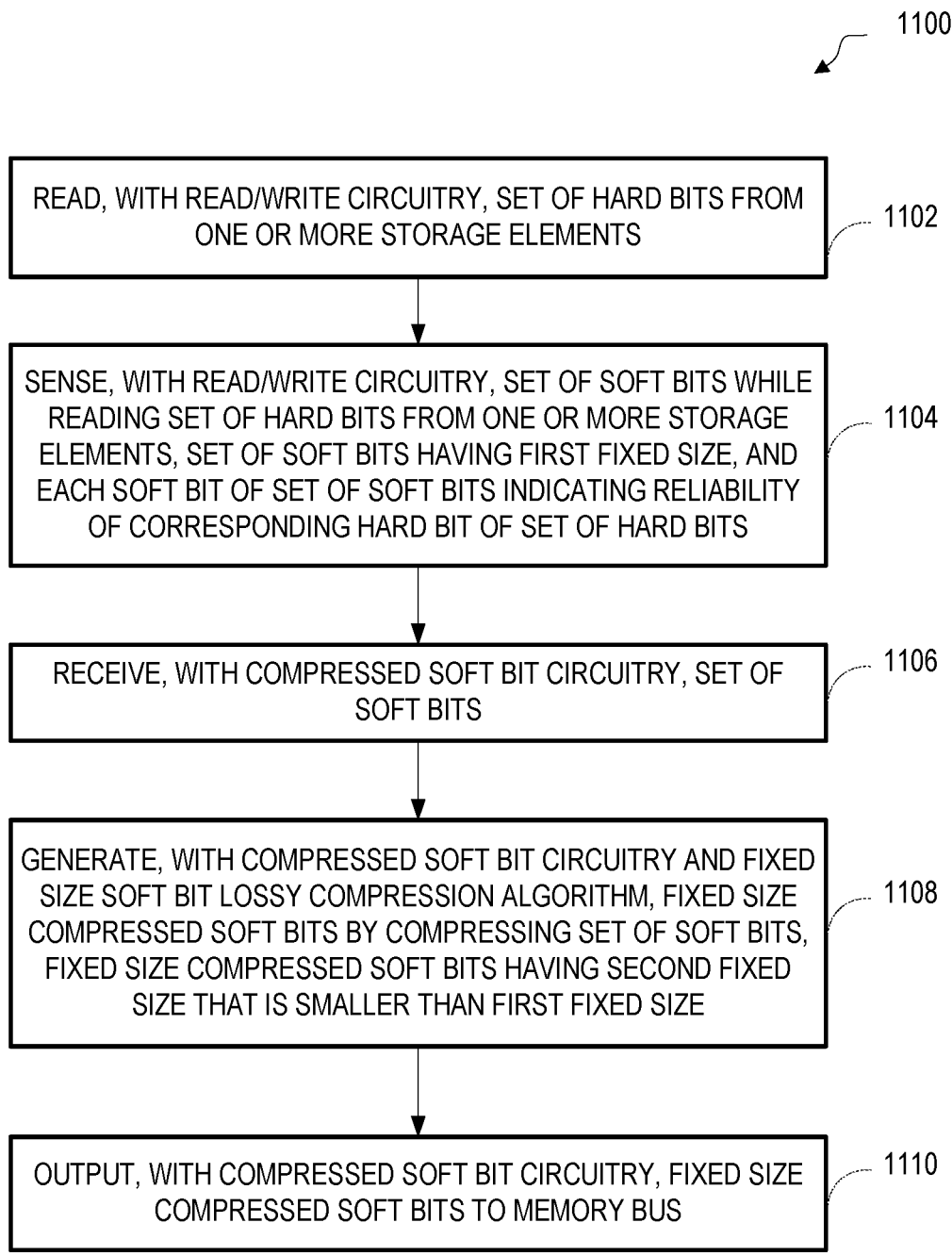
FIG. 11 is a flowchart illustrating an example method for performing fixed size soft bit lossy compression, in accordance with some embodiments of the disclosure.

FIG. 11 is a flowchart illustrating an example method 1100 for performing fixed size soft bit lossy compression, in accordance with some embodiments of the disclosure. FIG. 11 is described with respect to FIG. 1.

In the example of FIG. 11, the method 1100 includes reading, with read/write circuitry, a set of hard bits from one or more storage elements (at block 1102). For example, the read/write circuitry 140 reads a set of hard bits from one or more storage elements 109A and 109N.

The method 1100 further includes sensing, with the read/write circuitry, a set of soft bits while reading the set of hard bits from the one or more storage elements, the set of soft bits having a first fixed size, and each soft bit of the set of soft bits indicating a reliability of a corresponding hard bit of the set of hard bits (at block 1104). For example, the read/write circuitry 140 senses a set of soft bits while reading the set of hard bits from the one or more storage elements 109A and 109N, the set of soft bits having a first fixed size, and each soft bit of the set of soft bits indicating a reliability of a corresponding hard bit of the set of hard bits.

The method 1100 further includes receiving, with compressed soft bit circuitry, the set of soft bits (at block 1106). For example, the CSB circuitry 118 receives the set of soft bits.

The method 1100 further includes generating, with the compressed soft bit circuitry and a fixed size soft bit lossy compression algorithm, a fixed size compressed soft bits by compressing the set of soft bits, the fixed size compressed soft bits having a second fixed size that is smaller than the first fixed size (at block 1108). For example, the CSB circuitry 118 generates the fixed size compressed soft bits 138 by compressing the set of soft bits, the fixed size compressed soft bits 138 having a second fixed size that is smaller than the first fixed size.

The method 1100 also includes outputting, with the compressed soft bit circuitry, the fixed size compressed soft bits to a memory-to-controller bus (at block 1110). For example, the CSB circuitry 118 outputs the fixed size compressed soft bits 138 to a memory-to-controller bus. The size of the fixed compressed soft bits 138 may be based on the size of the memory-to-controller bus 106.

In some examples, generating, with the compressed soft bit circuitry and the fixed size soft bit lossy compression algorithm, the fixed size compressed soft bits by compressing the set of soft bits may further include determining whether a first portion of the set of soft bits includes a first marked bit, a value and a location of the first marked bit indicating a hard bit in the set of hard bits is unreliable, generating a first index that indicates the value and the location of the first marked bit in response to determining that the first portion includes the first marked bit, determining whether a second portion of the set of soft bits includes a second marked bit, a value and a location of the second marked bit indicating a second hard bit in the set of hard bits is unreliable, and generating a second index that indicates the value and the location of the second marked bit in response to determining that the second portion includes the second marked bit.

In these examples, wherein generating, with the compressed soft bit circuitry and the fixed size soft bit lossy compression algorithm, the fixed size compressed soft bits by compressing the set of soft bits may further include generating a third index that indicates there are no unreliable bits in the first portion in response to determining that the first portion does not include the first marked bit, and generating a fourth index that indicates there are no unreliable bits in the second portion in response to determining that the second portion does not include the second marked bit.

In some examples, the first portion and the second portion may each include all soft bits in the set of soft bits, and a size of the first index and a size of the second index are equal to each other. In other examples, the first portion and the second portion may each include less than all soft bits in the set of soft bits, and a size of the first index and a size of the second index are equal to each other. In yet other examples, the first portion and the second portion may each include less than all soft bits in the set of soft bits, and a size of the first index and a size of the second index are not equal to each other.

In some examples, generating, with the compressed soft bit circuitry and the fixed size soft bit lossy compression algorithm, the fixed size compressed soft bits by compressing the set of soft bits further includes determining whether a first portion of the set of soft bits includes one or more marked bits, a value and a location of each of the one or more marked bits indicating a corresponding hard bit in the set of hard bits is unreliable, determining whether a second portion of the set of soft bits includes a second one or more marked bits, a value and a location of each of the second one or more marked bits indicating a corresponding second hard bit in the set of hard bits is unreliable, in response to determining that the first portion does not include the one or more marked bits and the second portion do not include the second one or more marked bits, generate a first index that indicates a first binary null value and a second index that indicates a second binary null value, in response to determining that the first portion includes one of the one or more marked bits and the second portion does not include the second one or more marked bits, generating a third index that indicates a first binary value of the location of the one of the one or more marked bits and a fourth index that indicates a third binary null value, in response to determining that the first portion does not include the one or more marked bits and the second portion includes one of the second one or more marked bits, generating a fifth index that indicates a fourth binary null value and a sixth index that indicates a second binary value of the location of the one of the second one or more marked bits, in response to determining that the first portion includes the one of the one or more marked bits and the second portion includes the one of the second one or more marked bits, generating a seventh index that indicates a third binary value of the location of the one of the one or more marked bits and an eighth index that indicates a fourth binary value of the location of the one of the second one or more marked bits, in response to determining that the first portion does not include the one or more marked bits and the second portion includes two of the second one or more marked bits, generating a ninth index that indicates a fifth binary value of the location of a first one of the second one or more marked bits and a tenth index that indicates a sixth binary value of the location of a second one of the second one or more marked bits, and in response to determining that the first portion includes two of the one or more marked bits and the second portion does not include the second one or more marked bits, generating an eleventh index that indicates a seventh binary value of the location of a first one of the one or more marked bits and a twelfth index that indicates an eighth binary value of an offset of the location of a second one of the second one or more marked bits from the location of the first one of the one or more marked bits. In these examples, the first portion and the second portion are each less than all soft bits in the set of soft bits.

In some examples, generating, with the compressed soft bit circuitry and the fixed size soft bit lossy compression algorithm, the fixed size compressed soft bits by compressing the set of soft bits further includes determining whether one or more bytes of a first set of bytes of the set of soft bits includes one or more marked bits, a value and a location of each of the one or more marked bits indicating a corresponding hard bit in the set of hard bits is unreliable, determining whether a second one or more bytes of a second set of bytes of the set of soft bits includes a second one or more marked bits, a value and a location of each of the second one or more marked bits indicating a corresponding hard bit in the set of hard bits is unreliable, in response to determining that the one or more bytes of the first set of bytes of the set of soft bits does not include one or more marked bits and the second one or more bytes of the second set of bytes of the set of soft bits does not include the second one or more marked bits, generating the fixed size compressed soft bits with a first null binary value and a second null binary value, in response to determining that the one or more bytes of the first set of bytes of the set of soft bits includes one of the one or more marked bits and the second one or more bytes of the second set of bytes of the set of soft bits does not include the second one or more marked bits, generating the fixed size compressed soft bits with a first binary value that indicates a first byte location of the one of the one or more marked bits and a third null binary value, in response to determining that the one or more bytes of the first set of bytes of the set of soft bits does not include the one or more marked bits and the second one or more bytes of the second set of bytes of the set of soft bits includes one of the second one or more marked bits, generating the fixed size compressed soft bits with a fourth null binary value and a second binary value that indicates a second byte location of the one of the second one or more marked bits, in response to determining that the one or more bytes of the first set of bytes of the set of soft bits includes one of the one or more marked bits and the second one or more bytes of the second set of bytes of the set of soft bits includes one of the second one or more marked bits, generating the fixed size compressed soft bits with a third binary value that indicates a third byte location of the one of the one or more marked bits and a fourth binary value that indicates a fourth byte location of the one of the second one or more marked bits, in response to determining that the one or more bytes of the first set of bytes of the set of soft bits does not include the one or more marked bits and the second one or more bytes of the second set of bytes of the set of soft bits includes two of the second one or more marked bits, generating the fixed size compressed soft bits with a fifth null binary value and a fifth binary value that indicates a fifth byte location of a first one of the second one or more marked bits and a sixth byte location of a second one of the second one or more marked bits, and in response to determining that the one or more bytes of the first set of bytes of the set of soft bits includes two of the one or more marked bits and the second one or more bytes of the second set of bytes of the set of soft bits does not include the second one or more marked bits, generating a sixth binary value that indicates a seventh byte location of a first one of the one or more marked bits and an eighth binary value that indicates a seventh byte location of a second one of the one or more marked bits that is an offset from the seventh byte location.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory, comprising:
    one or more storage elements;
    read/write circuitry configured to:
        read a set of hard bits from the one or more storage elements, and
        sense a set of soft bits while reading the set of hard bits from the one or more storage elements, the set of soft bits having a first fixed size, and each soft bit of the set of soft bits indicating a reliability of a corresponding hard bit of the set of hard bits; and
    compressed soft bit circuitry configured to:
        receive the set of soft bits,
        generate, with a fixed size soft bit lossy compression algorithm, a fixed size compressed soft bits by compressing the set of soft bits, the fixed size compressed soft bits having a second fixed size that is smaller than the first fixed size, and
        output the fixed size compressed soft bits to a memory-to-controller bus.

2. The memory of claim 1, wherein, to generate, with the fixed size soft bit lossy compression algorithm, the fixed size compressed soft bits by compressing the set of soft bits, the compressed soft bit circuitry is further configured to:

determine whether a first portion of the set of soft bits includes a first marked bit, a value and a location of the first marked bit indicating one hard bit in the set of hard bits is unreliable, generate a first index that indicates the value and the location of the first marked bit in response to determining that the first portion includes the first marked bit, determine whether a second portion of the set of soft bits includes a second marked bit, a value and a location of the second marked bit indicating a second hard bit in the set of hard bits is unreliable, and generate a second index that indicates the value and the location of the second marked bit in response to determining that the second portion includes the second marked bit.

3. The memory of claim 2, wherein, to generate the fixed size compressed soft bits by compressing the set of soft bits, the compressed soft bit circuitry is further configured to:

generate a third index that indicates there are no unreliable bits in the first portion in response to determining that the first portion does not include the first marked bit, and generate a fourth index that indicates there are no unreliable bits in the second portion in response to determining that the second portion does not include the second marked bit.

4. The memory of claim 2, wherein the first portion and the second portion each include all soft bits in the set of soft bits, and wherein a size of the first index and a size of the second index are equal to each other.

5. The memory of claim 2, wherein the first portion and the second portion each includes less than all soft bits in the set of soft bits, and wherein a size of the first index and a size of the second index are equal to each other.

6. The memory of claim 2, wherein the first portion and the second portion each includes less than all soft bits in the set of soft bits, and wherein a size of the first index and a size of the second index are not equal to each other.

7. The memory of claim 1, wherein, to generate with the fixed size soft bit lossy compression algorithm, the fixed size compressed soft bits by compressing the set of soft bits, the compressed soft bit circuitry is further configured to:

determine whether a first portion of the set of soft bits includes one or more marked bits, a value and a location of each of the one or more marked bits indicating one hard bit in the set of hard bits is unreliable, determine whether a second portion of the set of soft bits includes a second one or more marked bits, a value and a location of each of the second one or more marked bits indicating a corresponding a second hard bit in the set of hard bits is unreliable, in response to determining that the first portion does not include the one or more marked bits and the second portion do not include the second one or more marked bits, generate a first index that indicates a first binary null value and a second index that indicates a second binary null value, in response to determining that the first portion includes one of the one or more marked bits and the second portion does not include the second one or more marked bits, generate a third index that indicates a first binary value of the location of the one of the one or more marked bits and a fourth index that indicates a third binary null value, in response to determining that the first portion does not include the one or more marked bits and the second portion includes one of the second one or more marked bits, generate a fifth index that indicates a fourth binary null value and a sixth index that indicates a second binary value of the location of the one of the second one or more marked bits, in response to determining that the first portion includes the one of the one or more marked bits and the second portion includes the one of the second one or more marked bits, generate a seventh index that indicates a third binary value of the location of the one of the one or more marked bits and an eighth index that indicates a fourth binary value of the location of the one of the second one or more marked bits, in response to determining that the first portion does not include the one or more marked bits and the second portion includes two of the second one or more marked bits, generate a ninth index that indicates a fifth binary value of the location of a first one of the second one or more marked bits and a tenth index that indicates a sixth binary value of the location of a second one of the second one or more marked bits, and in response to determining that the first portion includes two of the one or more marked bits and the second portion does not include the second one or more marked bits, generate an eleventh index that indicates a seventh binary value of the location of a first one of the one or more marked bits and a twelfth index that indicates an eighth binary value of an offset of the location of a second one of the second one or more marked bits from the location of the first one of the one or more marked bits, wherein the first portion and the second portion are each less than all soft bits in the set of soft bits.

8. The memory of claim 1, wherein, to generate with the fixed size soft bit lossy compression algorithm, the fixed size compressed soft bits by compressing the set of soft bits, the compressed soft bit circuitry is further configured to:

determine whether one or more bytes of a first set of bytes of the set of soft bits includes one or more marked bits, a value and a location of each of the one or more marked bits indicating one hard bit in the set of hard bits is unreliable, determine whether a second one or more bytes of a second set of bytes of the set of soft bits includes a second one or more marked bits, a value and a location of each of the second one or more marked bits indicating a second hard bit in the set of hard bits is unreliable, in response to determining that the one or more bytes of the first set of bytes of the set of soft bits does not include the one or more marked bits and the second one or more bytes of the second set of bytes of the set of soft bits does not include the second one or more marked bits, generate the fixed size compressed soft bits with a first null binary value and a second null binary value, in response to determining that the one or more bytes of the first set of bytes of the set of soft bits includes one of the one or more marked bits and the second one or more bytes of the second set of bytes of the set of soft bits does not include the second one or more marked bits, generate the fixed size compressed soft bits with a first binary value that indicates a first byte location of the one of the one or more marked bits and a third null binary value, in response to determining that the one or more bytes of the first set of bytes of the set of soft bits does not include the one or more marked bits and the second one or more bytes of the second set of bytes of the set of soft bits includes one of the second one or more marked bits, generate the fixed size compressed soft bits with a fourth null binary value and a second binary value that indicates a second byte location of the one of the second one or more marked bits, in response to determining that the one or more bytes of the first set of bytes of the set of soft bits includes one of the one or more marked bits and the second one or more bytes of the second set of bytes of the set of soft bits includes one of the second one or more marked bits, generate the fixed size compressed soft bits with a third binary value that indicates a third byte location of the one of the one or more marked bits and a fourth binary value that indicates a fourth byte location of the one of the second one or more marked bits, in response to determining that the one or more bytes of the first set of bytes of the set of soft bits does not include the one or more marked bits and the second one or more bytes of the second set of bytes of the set of soft bits includes two of the second one or more marked bits, generate the fixed size compressed soft bits with a fifth null binary value and a fifth binary value that indicates a fifth byte location of a first one of the second one or more marked bits and a sixth byte location of a second one of the second one or more marked bits, and in response to determining that the one or more bytes of the first set of bytes of the set of soft bits includes two of the one or more marked bits and the second one or more bytes of the second set of bytes of the set of soft bits does not include the second one or more marked bits, generate a sixth binary value that indicates a seventh byte location of a first one of the one or more marked bits and a seventh binary value that indicates an eighth byte location of a second one of the one or more marked bits that is an offset from the seventh byte location.

9. A method, comprising:

reading, with read/write circuitry, a set of hard bits from one or more storage elements;

sensing, with the read/write circuitry, a set of soft bits while reading the set of hard bits from the one or more storage elements, the set of soft bits having a first fixed size, and each soft bit of the set of soft bits indicating a reliability of a corresponding hard bit of the set of hard bits;

receiving, with compressed soft bit circuitry, the set of soft bits;

generating, with the compressed soft bit circuitry and a fixed size soft bit lossy compression algorithm, a fixed size compressed soft bits by compressing the set of soft bits, the fixed size compressed soft bits having a second fixed size that is smaller than the first fixed size; and outputting, with the compressed soft bit circuitry, the fixed size compressed soft bits to a memory-to-controller bus.

10. The method of claim 9, wherein generating, with the compressed soft bit circuitry and the fixed size soft bit lossy compression algorithm, the fixed size compressed soft bits by compressing the set of soft bits further includes:

determining whether a first portion of the set of soft bits includes a first marked bit, a value and a location of the first marked bit indicating one hard bit in the set of hard bits is unreliable, generating a first index that indicates the value and the location of the first marked bit in response to determining that the first portion includes the first marked bit, determining whether a second portion of the set of soft bits includes a second marked bit, a value and a location of the second marked bit indicating a second hard bit in the set of hard bits is unreliable, and generating a second index that indicates the value and the location of the second marked bit in response to determining that the second portion includes the second marked bit.

11. The method of claim 10, wherein generating, with the compressed soft bit circuitry and the fixed size soft bit lossy compression algorithm, the fixed size compressed soft bits by compressing the set of soft bits further includes generating a third index that indicates there are no unreliable bits in the first portion in response to determining that the first portion does not include the first marked bit, and generating a fourth index that indicates there are no unreliable bits in the second portion in response to determining that the second portion does not include the second marked bit.

12. The method of claim 10, wherein the first portion and the second portion each include all soft bits in the set of soft bits, and wherein a size of the first index and a size of the second index are equal to each other.

13. The method of claim 10, wherein the first portion and the second portion each includes less than all soft bits in the set of soft bits, and wherein a size of the first index and a size of the second index are equal to each other.

14. The method of claim 10, wherein the first portion and the second portion each includes less than all soft bits in the set of soft bits, and wherein a size of the first index and a size of the second index are not equal to each other.

15. The method of claim 9, wherein generating, with the compressed soft bit circuitry and the fixed size soft bit lossy compression algorithm, the fixed size compressed soft bits by compressing the set of soft bits further includes:

determining whether a first portion of the set of soft bits includes one or more marked bits, a value and a location of each of the one or more marked bits indicating one hard bit in the set of hard bits is unreliable, determining whether a second portion of the set of soft bits includes a second one or more marked bits, a value and a location of each of the second one or more marked bits indicating a corresponding second hard bit in the set of hard bits is unreliable, in response to determining that the first portion does not include the one or more marked bits and the second portion do not include the second one or more marked bits, generate a first index that indicates a first binary null value and a second index that indicates a second binary null value, in response to determining that the first portion includes one of the one or more marked bits and the second portion does not include the second one or more marked bits, generating a third index that indicates a first binary value of the location of the one of the one or more marked bits and a fourth index that indicates a third binary null value, in response to determining that the first portion does not include the one or more marked bits and the second portion includes one of the second one or more marked bits, generating a fifth index that indicates a fourth binary null value and a sixth index that indicates a second binary value of the location of the one of the second one or more marked bits, in response to determining that the first portion includes the one of the one or more marked bits and the second portion includes the one of the second one or more marked bits, generating a seventh index that indicates a third binary value of the location of the one of the one or more marked bits and an eighth index that indicates a fourth binary value of the location of the one of the second one or more marked bits, in response to determining that the first portion does not include the one or more marked bits and the second portion includes two of the second one or more marked bits, generating a ninth index that indicates a fifth binary value of the location of a first one of the second one or more marked bits and a tenth index that indicates a sixth binary value of the location of a second one of the second one or more marked bits, and in response to determining that the first portion includes two of the one or more marked bits and the second portion does not include the second one or more marked bits, generating an eleventh index that indicates a seventh binary value of the location of a first one of the one or more marked bits and a twelfth index that indicates an eighth binary value of an offset of the location of a second one of the second one or more marked bits from the location of the first one of the one or more marked bits, wherein the first portion and the second portion are each less than all soft bits in the set of soft bits.

16. The method of claim 9, wherein generating, with the compressed soft bit circuitry and the fixed size soft bit lossy compression algorithm, the fixed size compressed soft bits by compressing the set of soft bits further includes:

determining whether one or more bytes of a first set of bytes of the set of soft bits includes one or more marked bits, a value and a location of each of the one or more marked bits indicating one hard bit in the set of hard bits is unreliable, determining whether a second one or more bytes of a second set of bytes of the set of soft bits includes a second one or more marked bits, a value and a location of each of the second one or more marked bits indicating a second hard bit in the set of hard bits is unreliable, in response to determining that the one or more bytes of the first set of bytes of the set of soft bits does not include the one or more marked bits and the second one or more bytes of the second set of bytes of the set of soft bits does not include the second one or more marked bits, generate the fixed size compressed soft bits with a first null binary value and a second null binary value, in response to determining that the one or more bytes of the first set of bytes of the set of soft bits includes one of the one or more marked bits and the second one or more bytes of the second set of bytes of the set of soft bits does not include the second one or more marked bits, generate the fixed size compressed soft bits with a first binary value that indicates a first byte location of the one of the one or more marked bits and a third null binary value, in response to determining that the one or more bytes of the first set of bytes of the set of soft bits does not include the one or more marked bits and the second one or more bytes of the second set of bytes of the set of soft bits includes one of the second one or more marked bits, generate the fixed size compressed soft bits with a fourth null binary value and a second binary value that indicates a second byte location of the one of the second one or more marked bits, in response to determining that the one or more bytes of the first set of bytes of the set of soft bits includes one of the one or more marked bits and the second one or more bytes of the second set of bytes of the set of soft bits includes one of the second one or more marked bits, generate the fixed size compressed soft bits with a third binary value that indicates a third byte location of the one of the one or more marked bits and a fourth binary value that indicates a fourth byte location of the one of the second one or more marked bits, in response to determining that the one or more bytes of the first set of bytes of the set of soft bits does not include the one or more marked bits and the second one or more bytes of the second set of bytes of the set of soft bits includes two of the second one or more marked bits, generate the fixed size compressed soft bits with a fifth null binary value and a fifth binary value that indicates a fifth byte location of a first one of the second one or more marked bits and a sixth byte location of a second one of the second one or more marked bits, and in response to determining that the one or more bytes of the first set of bytes of the set of soft bits includes two of the one or more marked bits and the second one or more bytes of the second set of bytes of the set of soft bits does not include the second one or more marked bits, generate a sixth binary value that indicates a seventh byte location of a first one of the one or more marked bits and a seventh binary value that indicates an eighth byte location of a second one of the one or more marked bits that is an offset from the seventh byte location.

17. An apparatus, comprising:

means for reading a set of hard bits from one or more storage elements;

means for sensing a first set of soft bits while reading the set of hard bits from the one or more storage elements, the first set of soft bits having a first fixed size, and each soft bit of the first set of soft bits indicating a reliability of a corresponding hard bit of the set of hard bits;

means for generating, with a fixed size soft bit lossy compression algorithm, a fixed size compressed soft bits by compressing the first set of soft bits, the fixed size compressed soft bits having a second fixed size that is smaller than the first fixed size;

means for decompressing the fixed size compressed soft bits to determine a second set of soft bits; and means for decoding read data with the second set of soft bits, wherein the second set of soft bits is different than the first set of soft bits.

18. The apparatus of claim 17, wherein means for generating, with the fixed size soft bit lossy compression algorithm, the fixed size compressed soft bits by compressing the first set of soft bits further includes means for determining whether a first portion of the first set of soft bits includes a first marked bit, a value and a location of the first marked bit indicating one hard bit in the set of hard bits is unreliable;

means for generating a first index that indicates the value and the location of the first marked bit in response to determining that the first portion includes the first marked bit;

means for determining whether a second portion of the first set of soft bits includes a second marked bit, a value and a location of the second marked bit indicating a second hard bit in the set of hard bits is unreliable; and means for generating a second index that indicates the value and the location of the second marked bit in response to determining that the second portion includes the second marked bit.

19. The apparatus of claim 17, wherein means for generating, with the fixed size soft bit lossy compression algorithm, the fixed size compressed soft bits by compressing the first set of soft bits further includes means for determining whether a first portion of the first set of soft bits includes one or more marked bits, a value and a location of each of the one or more marked bits indicating one hard bit in the set of hard bits is unreliable;

means for determining whether a second portion of the first set of soft bits includes a second one or more marked bits, a value and a location of each of the second one or more marked bits indicating a corresponding second hard bit in the set of hard bits is unreliable;

in response to determining that the first portion and the second portion do not include the second one or more marked bits, means for generating a first index that indicates a first binary null value and a second index that indicates a second binary null value;

in response to determining that the first portion includes one of the one or more marked bits and the second portion does not include the second one or more marked bits, means for generating a third index that indicates a first binary value of the location of the one of the one or more marked bits and a fourth index that indicates a third binary null value;

in response to determining that the first portion does not include the one or more marked bits and the second portion includes one of the second one or more marked bits, means for generating a fifth index that indicates a fourth binary null value and a sixth index that indicates a second binary value of the location of the one of the second one or more marked bits;

in response to determining that the first portion includes the one of the one or more marked bits and the second portion includes the one of the second one or more marked bits, means for generating a seventh index that indicates a third binary value of the location of the one of the one or more marked bits and an eighth index that indicates a fourth binary value of the location of the one of the second one or more marked bits;

in response to determining that the first portion does not include the one or more marked bits and the second portion includes two of the second one or more marked bits, means for generating a ninth index that indicates a fifth binary value of the location of a first one of the second one or more marked bits and a tenth index that indicates a sixth binary value of the location of a second one of the second one or more marked bits; and in response to determining that the first portion includes two of the one or more marked bits and the second portion does not include the second one or more marked bits, means for generating an eleventh index that indicates a seventh binary value of the location of a first one of the one or more marked bits and a twelfth index that indicates an eighth binary value of an offset of the location of a second one of the second one or more marked bits from the location of the first one of the one or more marked bits, wherein the first portion and the second portion are each less than all soft bits in the first set of soft bits.

20. The apparatus of claim 17, wherein means for generating, with the fixed size soft bit lossy compression algorithm, the fixed size compressed soft bits by compressing the first set of soft bits further includes means for determining whether one or more bytes of a first set of bytes of the first set of soft bits includes one or more marked bits, a value and a location of each of the one or more marked bits indicating one hard bit in the set of hard bits is unreliable;

means for determining whether a second one or more bytes of a second set of bytes of the first set of soft bits includes a second one or more marked bits, a value and a location of each of the second one or more marked bits indicating a second hard bit in the set of hard bits is unreliable;

in response to determining that the one or more bytes of the first set of bytes of the first set of soft bits does not include the one or more marked bits and the second one or more bytes of the second set of bytes of the first set of soft bits does not include the second one or more marked bits, means for generating the fixed size compressed soft bits with a first null binary value and a second null binary value;

in response to determining that the one or more bytes of the first set of bytes of the first set of soft bits includes one of the one or more marked bits and the second one or more bytes of the second set of bytes of the first set of soft bits does not include the second one or more marked bits, means for generating the fixed size compressed soft bits with a first binary value that indicates a first byte location of the one of the one or more marked bits and a third null binary value;

in response to determining that the one or more bytes of the first set of bytes of the first set of soft bits does not include the one or more marked bits and the second one or more bytes of the second set of bytes of the first set of soft bits includes one of the second one or more marked bits, means for generating the fixed size compressed soft bits with a fourth null binary value and a second binary value that indicates a second byte location of the one of the second one or more marked bits, in response to determining that the one or more bytes of the first set of bytes of the first set of soft bits includes one of the one or more marked bits and the second one or more bytes of the second set of bytes of the first set of soft bits includes one of the second one or more marked bits, means for generating the fixed size compressed soft bits with a third binary value that indicates a third byte location of the one of the one or more marked bits and a fourth binary value that indicates a fourth byte location of the one of the second one or more marked bits;

in response to determining that the one or more bytes of the first set of bytes of the first set of soft bits does not include the one or more marked bits and the second one or more bytes of the second set of bytes of the first set of soft bits includes two of the second one or more marked bits, means for generating the fixed size compressed soft bits with a fifth null binary value and a fifth binary value that indicates a fifth byte location of a first one of the second one or more marked bits and a sixth byte location of a second one of the second one or more marked bits; and in response to determining that the one or more bytes of the first set of bytes of the first set of soft bits includes two of the one or more marked bits and the second one or more bytes of the second set of bytes of the first set of soft bits does not include the second one or more marked bits, means for generating a sixth binary value that indicates a seventh byte location of a first one of the one or more marked bits and a seventh binary value that indicates an eighth byte location of a second one of the one or more marked bits that is an offset from the seventh byte location.

\* \* \* \* \*